United States Patent [19]

Coursolle

[11] Patent Number: 4,545,258
[45] Date of Patent: Oct. 8, 1985

[54] CIRCUIT WITH ADJUSTABLE AMPLITUDE AND ROLLOFF FREQUENCY CHARACTERISTICS

[75] Inventor: Thomas P. Coursolle, St. Paul, Minn.
[73] Assignee: Rosemount Inc., Eden Prairie, Minn.
[21] Appl. No.: 510,953
[22] Filed: Jul. 5, 1983
[51] Int. Cl.$^4$ ............................................. G01F 1/32
[52] U.S. Cl. .................................................. 73/861.22
[58] Field of Search ............... 330/149, 155, 305, 306; 328/167, 170; 333/17 R, 17 L; 73/861.22

[56] References Cited

U.S. PATENT DOCUMENTS

| | | | |
|---|---|---|---|
| 3,709,034 | 1/1973 | Herzl | 73/194 B |
| 3,864,972 | 2/1975 | Burgess et al. | 73/194 B |
| 3,885,432 | 5/1975 | Herzl | 73/194 B |
| 3,940,707 | 2/1976 | Fernandez | 330/107 X |
| 4,207,543 | 6/1980 | Izakson et al. | 333/17 R |
| 4,270,391 | 6/1981 | Herzl | 73/86 L |

OTHER PUBLICATIONS

Halkias, Christos C., and Millman, Jacob, *Integrated Electronics*, McGraw-Hill, 1972, pp. 340-341.

Primary Examiner—Eugene R. LaRoche
Assistant Examiner—Steven J. Mottola
Attorney, Agent, or Firm—Kinney & Lange

[57] ABSTRACT

An electrical circuit provides an output signal having a frequency representative of an input signal which has a fundamental frequency responsive to a parameter. The circuit has an amplifier having an adjustable amplitude response with an input coupled to the input signal and an output for providing the output signal as a function of the input signal. A filter is coupled to the amplifier and to the output signal for at least partially determining the amplitude response of the amplifier. The filter has an adjustable rolloff frequency characteristic. An adjustable impedance is coupled to the filter to adjust the amplitude response of the amplifier and adjust the rolloff frequency characteristic of the filter as a function of the input signal. A controller is coupled to the output signal and provides a control signal for adjusting the adjustable impedance and hence the amplitude response of the amplifier and the rolloff frequency characteristic of the filter as a function of the output signal.

20 Claims, 4 Drawing Figures

CIRCUIT WITH ADJUSTABLE AMPLITUDE AND ROLLOFF FREQUENCY CHARACTERISTICS

BACKGROUND OF THE INVENTION

Field of the Invention

The present invention relates to electrical circuits and in particular to an electrical circuit for amplifying an input signal, the circuit having an adjustable amplitude response and an adjustable rolloff frequency characteristic.

SUMMARY

The present invention comprises an electrical circuit for providing an output signal having a frequency representative of an input signal which has a fundamental frequency responsive to a parameter. The circuit includes an amplifier means having an input coupled to the input signal, an output for providing the output signal as a function of the input signal, and an adjustable amplitude response. A filter means which has an adjustable rolloff frequency characteristic is coupled to the amplifier means and to the output signal for at least partially determining the amplitude response of the amplifier means. A first adjustable impedance means is coupled to the filter means for adjusting the amplitude response of the amplifier means and adjusting the rolloff frequency characteristic of the filter means as a function of the input signal. A control means is coupled to the output signal for providing a control signal to the first adjustable impedance means to adjust the first adjustable impedance means as a function of the output signal. The amplitude of the input signal at the fundamental frequency varies proportionally as a function of the fundamental frequency. The control means preferably controls the rolloff frequency to be substantially equal to the fundamental frequency. At low fundamental frequencies, the input signal comprises higher frequency noise components which are attenuated by the filter means such that the output signal has an enhanced signal-to-noise ratio. As the fundamental frequency varies, the amplification of the amplifier means is controlled to change inversely proportional to the fundamental frequency in a selected manner. The amplitude of the fundamental frequency component of the input signal increases and decreases with corresponding increases and decreases in the fundamental frequency, while the amplification of the amplifier means is adjusted to decrease and increase respectively such that the amplitude of the output signal remains substantially constant. The amplification of the amplifier means is relatively constant. Input noise signals having frequencies less than the fundamental frequency are amplified by substantially the same amplification factor as the fundamental frequency component such that the lower frequency noise is not disproportionately amplified and desired signal-to-noise ratios are maintained.

In a further preferred embodiment, the amplifier means is a multi-stage amplifier with each stage having corresponding adjustable filter means coupled thereto. Each adjustable filter means has a first adjustable impedance which adjusts both the amplitude response of the amplifier means and the rolloff frequency characteristic of the filter means. The control means develops a control signal as a function of the amplitude of the output signal. The output signal is full wave rectified, averaged and coupled to a second adjustable impedance to develop a second control signal. The control signal is coupled to the second adjustable impedance to adjust the second adjustable impedance such that the second control signal is substantially constant. Preferably, the first and second adjustable impedances have substantially the same thermal characteristics and are proximately thermally coupled such that the amplitude and frequency characteristics are controlled by the first adjustable impedance to be constant with respect to temperature variations.

In yet a further preferred embodiment, the input signal is provided by a cantilevered beam vortex flowmeter sensor having a fundamental frequency proportional to flow. At low flow, the fundamental frequency amplitude is small and noise caused by fluid turbulence and other factors which are not repeatably representative of flow are comparatively large, but such noise is at frequencies higher than the fundamental frequency. As the flow increases, the fundamental frequency amplitude increases as the cube of flow. At higher flow, the circuit amplification is controlled to decrease, thus not disproportionately amplifying noise having frequencies less than the fundamental frequency while amplifying the fundamental frequency less than at low flow. The circuit enhances the input signal in low flow situations by providing its greatest amplification at low fundamental frequencies and filtering noise having higher frequencies such that the output signal is an enhanced sinusoidal signal having a fairly constant amplitude and a frequency representative of flow.

DETAILED DESCRIPTION OF THE PREFERRED EMBODIMENTS

Figure 1:
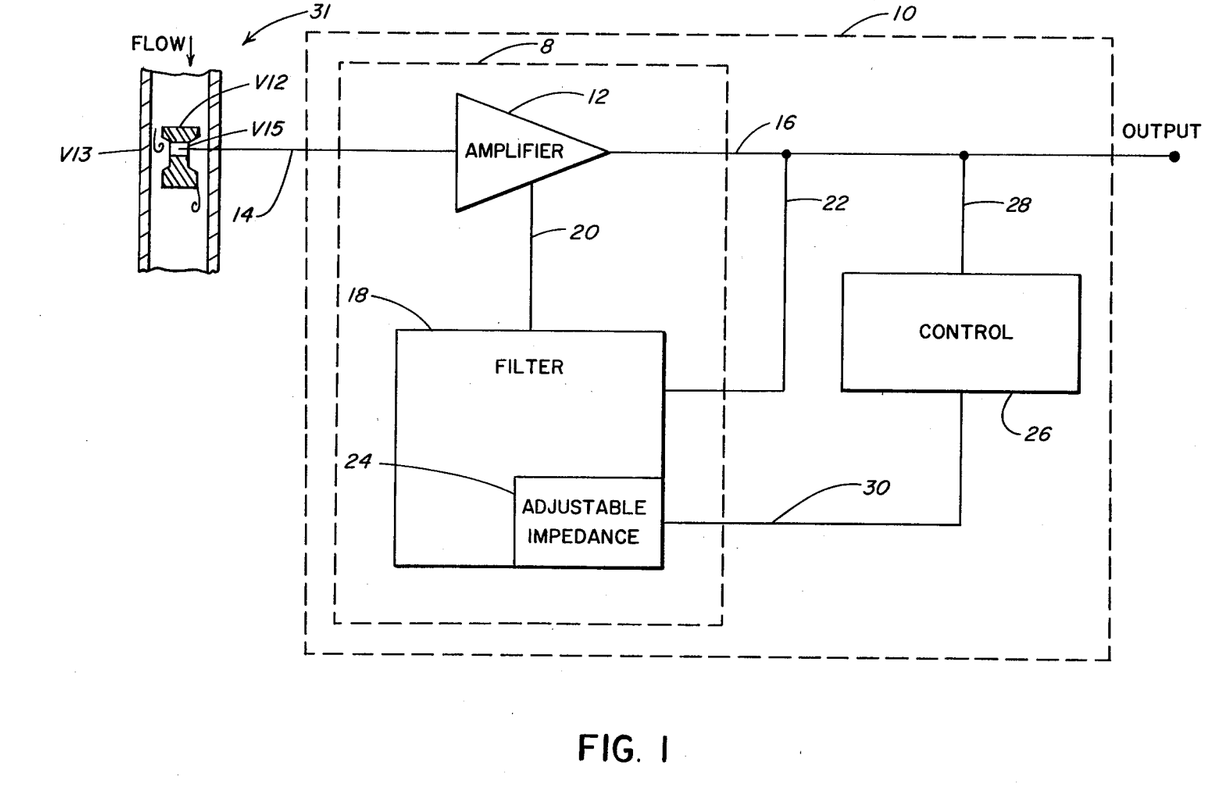
FIG. 1 is a block diagram representation of a preferred circuit in conjunction with a cross sectional representation of a flow pipe having a vortex sensor made according to the present invention.

A preferred circuit embodiment of the present invention is indicated generally at 10 in FIG. 1. An amplifier means 12 (also referred to as amplifier 12) has an adjustable amplitude response for amplifying an input signal provided on a line 14, and provides an output signal on a line 16 as a function of the input signal. The input signal comprises a fundamental signal having a fundamental frequency representative of a parameter such as a signal from a vortex sensor indicated generally at 31 and associated noise components at various frequencies. The vortex sensor 31 is more fully described in co-pending application Ser. No. 357,472 filed Mar. 12, 1982, which is assigned to the same assignee as this application. Vortex sensor 31 comprises a flow pipe V13 for conducting a fluid therethrough. A shedding body V12 is disposed in flow pipe V13 such that vortices are induced in the fluid as a function of fluid flow. The flow pipe V13 has a pressure sensor assembly V15 coupled thereto and disposed within the induced vortices for providing the input signal on line 14 representative of the vortices. The input signal includes noise components which are large compared to the fundamental frequency amplitude at low flow, but which are at a higher frequency. Such noise is caused by turbulence and other factors which are not known to be repeatably representative of flow. A first adjustable filter means 18 (also referred to as first adjustable filter 18) is coupled to amplifier 12 by a line 20 and is coupled to the output signal on line 16 by a line 22. Amplifier 12 and first adjustable filter 18 comprise a first stage amplifier 8 of the circuit 10. First adjustable filter 18 substantially determines the amplitude response of amplifier 12 and provides a low pass filter characteristic for filtering the output signal. First adjustable filter 18 has an adjustable rolloff frequency characteristic and is coupled to a first adjustable impedance means 24 (also referred to as first adjustable impedance 24). Adjustment of first adjustable impedance 24 adjusts the amplification of amplifier 12 and adjusts the rolloff frequency characteristic of first adjustable filter 18 preferably simultaneously. A control means 26 (also referred to as control circuit 26) is coupled to the output signal on line 16 by a line 28. Control circuit 26 provides a control signal on a line 30 to first adjustable impedance 24 to adjust first adjustable impedance 24 as a function of the output signal and therefore as a function of the input signal.

Control circuit 26 controls first adjustable impedance 24 such that the rolloff frequency of the rolloff frequency characteristic is controlled to be substantially equal to the fundamental frequency of the input signal. Amplifier 12 is controlled so that its amplification of noise having frequencies higher than the rolloff frequency decreases with increasing frequency while the amplification of noise having frequencies lower than the rolloff frequency is substantially constant. As the fundamental frequency of the input signal increases, the rolloff frequency is controlled to increase, thus tracking the low pass filter characteristic, while the amplification characteristic of the amplifier means is controlled to decrease. Similarly, decreases in the fundamental frequency of the input signal increase the amplification characteristic of amplifier 12 as a function of the amplitude of the fundamental frequency.

Circuit 10 enhances the input signal by providing its greatest amplification at low fundamental frequencies and filtering higher frequencies in low flow situations. In higher flow situations, circuit 10 amplification is controlled to decrease so that noise having frequencies less than the fundamental frequency is not disproportionately amplified while the fundamental frequency is amplified less. The output signal therefore is an enhanced sinusoidal signal having a fairly constant amplitude and a frequency representative of flow.

Figure 2A:
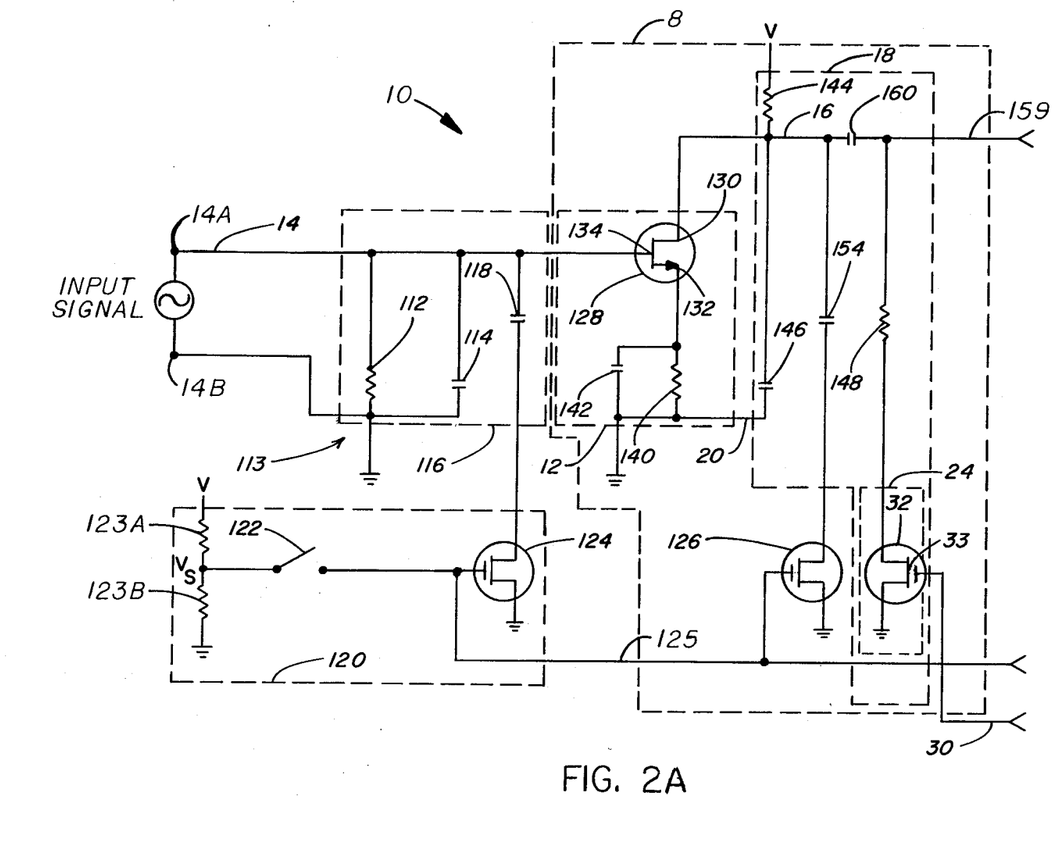
FIGS. 2A and 2B are a schematic representation of a further preferred circuit embodiment of the present invention having multiple amplifier stages.
Figure 2B:
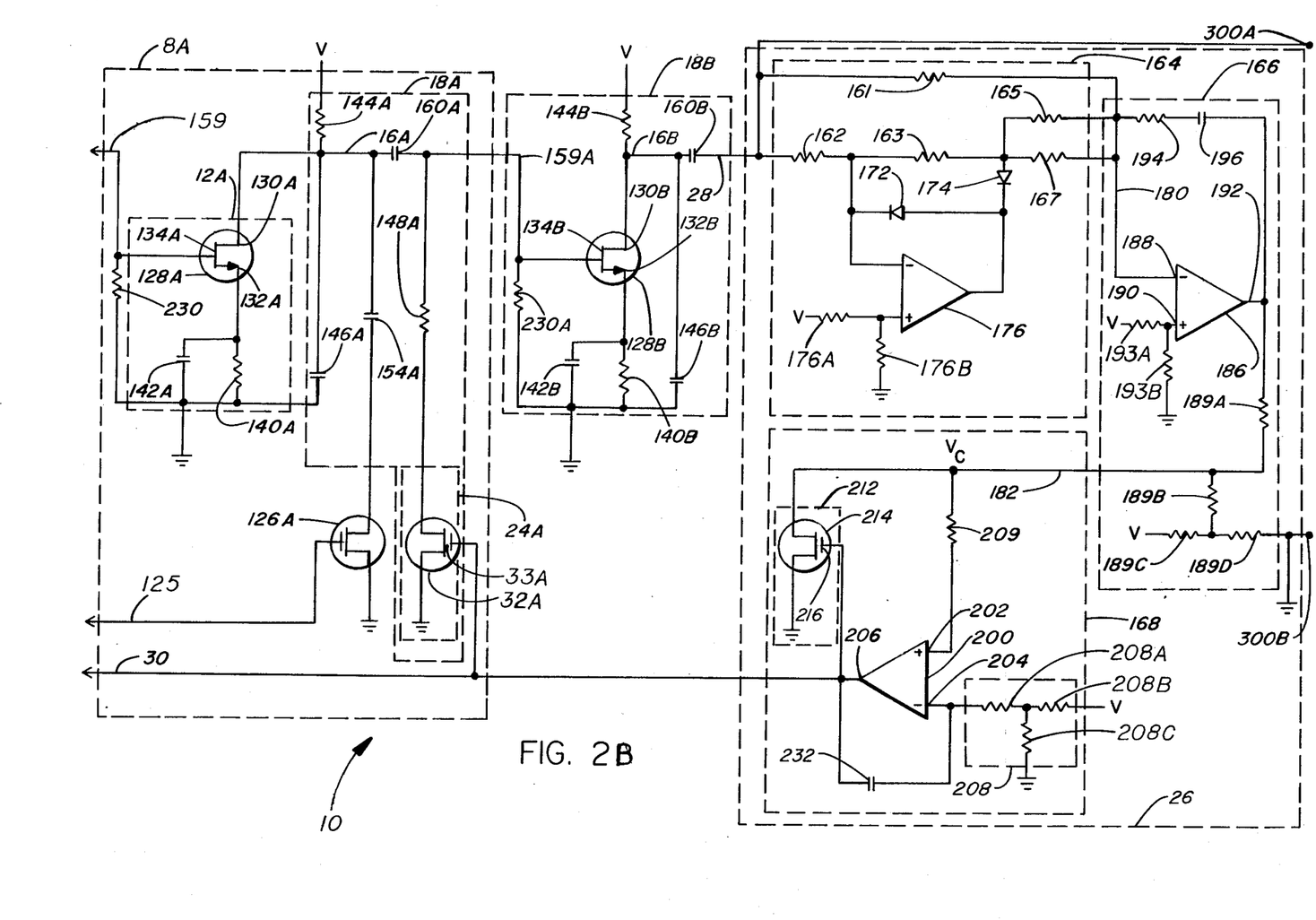

FIGS. 2A and 2B together are a schematic diagram of a preferred embodiment of the invention shown in FIG. 1, wherein the numbering is consistent with FIG. 1. In FIG. 2A, a pair of input terminals 14A and 14B receive the input signal. Terminal 14A is connected to line 14, while terminal 14B is connected to circuit common 113. A first resistor 112 and a first capacitor 114 are connected in parallel between line 14 and circuit common 113 and comprise a first filter means 116 (also referred to as first filter 116). First filter 116 is a low pass filter having a preselected rolloff frequency characteristic for providing a single pole AC impedance determined by the resistance of first resistor 112 and the capacitance of first capacitor 114. A second capacitor 118 is available for coupling in parallel with first resistor 112 and first capacitor 114 for providing a different rolloff frequency and AC impedance to accommodate different desired input signal characteristics. A switch means 120 which includes switch 122, voltage dividing resistors 123A and 123B, and a voltage controlled switch 124 permits selective coupling or uncoupling of second capacitor 118 to circuit common 113. Switch 122 selectively couples a switch voltage $V_s$ by a line 125 to the voltage controlled switch 124, which is coupled between second capacitor 11 and circuit common 113. Amplifier 12 is coupled to first filter 116 by line 14 and preferably includes a first depletion mode junction field effect transistor 128 having a drain 130, a source 132, and a gate 134. Gate 134 is coupled to the input signal and first filter 116 by line 14. Source 132 of first depletion mode transistor 128 is coupled through a second resistor 140 coupled in parallel with a third capacitor 142 to circuit common 113. Drain 130 is coupled to a supply voltage V through a third resistor 144. Second resistor 140 and third resistor 144 provide a DC bias point for first depletion mode transistor 128. Third capacitor 142 provides an AC coupling of the source 132 of depletion mode transistor 128 to circuit common 113. It is noted that in other embodiments of the present invention where first filter 116 is not coupled to circuit common 113, that amplifier 12 preferably comprises a differential amplifier. This is desirable particularly where the input signal is a differential signal.

First adjustable filter 18 includes third resistor 144 coupled between supply voltage V and line 16, a fourth capacitor 146 coupled between line 16 and circuit common 113, and a fourth resistor 148 coupled between line 159 and first adjustable impedance 24. First adjustable filter 18 has a minimum rolloff frequency characteristic determined substantially by third resistor 144 and fourth capacitor 146. First adjustable impedance 24 is series coupled with fourth resistor 148 between line 16 and circuit common 113. First adjustable impedance 24 preferably comprises a first enhancement mode metal-oxide-semiconductor or junction field effect transistor 32 having a gate 33 coupled to the control signal on line 30 and having a drain-to-source resistance series coupled between fourth resistor 148 and circuit common 113, the drain-to-source resistance being controlled by the control signal on line 30. A fifth capacitor 154 is optionally switched in parallel with fourth capacitor 146 by switching means 120 which is coupled to a voltage controlled switch 126 to change the minimum rolloff frequency characteristic of first adjustable filter 18 to accommodate different input signal characteristics.

Line 16 is coupled by an AC coupling sixth capacitor 160 to a second stage amplifier 8A in FIG. 2B, comprising a second amplifier 12A and a second adjustable filter 18A. Second stage amplifier 8A is preferably identical to first stage amplifier 8 and is numbered the same except with the letter "A" following each number to provide a further amplified and filtered output signal on a line 159. Second stage amplifier 8A preferably has a minimum rolloff frequency characteristic which is changeable by inclusion of a seventh capacitor 154A which is controlled by switch 122 and a voltage controlled switch 126A. The second stage amplifier 8A is AC coupled by an eighth capacitor 160A to an output amplifier means 8B by line 159A. The output amplifier means 8B provides a further amplification of the output signal on line 28 and is numbered consistently with amplifier means 8 and 8A with the letter "B" following each number.

Control circuit 26 is AC coupled to the further amplified output signal on line 28 through a ninth capacitor 160B and further comprises a rectification means 164, an averaging means 166 and a converting means 168.

Control circuit 26 provides the control signal on line 30 to first adjustable impedance 24 and 24A as a function of the amplified output signal on line 28. The rectification means 164 is coupled to line 28 and full wave rectifies the output signal in a conventional manner. The rectification means comprises a first diode 172, a second diode 174, and a first amplifier 176, voltage divider resistors 176A and 176B, and a plurality of resistors, 161, 162, 163, 165 and 167. The rectification means 164 provides a full wave rectified output signal on a line 180. Line 180 is coupled to averaging means 166 which averages the rectified output signal in a conventional manner to provide an averaged signal on a line 182.

The averaging means comprises a second amplifier 186, resistors 189A, 189B, 189C, and 189D, voltage divider resistors 193A and 193B, fifth resistor 194, and tenth capacitor 196. Amplifier 186 has a first input 188, a second input 190 and an output 192. First input 188 of second amplifier 186 is coupled to the rectified output signal by line 180, while second input 190 receives a reference voltage from the junction of voltage divider resistors 193A and 193B. Output 192 of second amplifier 186 is coupled to first input 188 through series coupled fifth resistor 194 and tenth capacitor 196, which serve to average the rectified output signal. Output 192 is also coupled through a resistance network formed by resistors 189A, 189B, 189C, and 189D to line 182.

The converting means 168 receives the averaged signal which is preferably an electrical current on line 182 and provides the control signal on line 30. The converting means 168 comprises a third amplifier 200 having a first input 202, a second input 204 and an output 206. The second input 204 of third amplifier 200 is coupled to a reference voltage provided by a resistance network 208 comprising resistors 208A, 208B, and 208C. The first input 202 of third amplifier 200 is coupled through a resistor 209 to the averaged signal on line 182. Line 182 is also coupled to circuit common 113 through a second adjustable impedance means 212. Second adjustable impedance means 212 has an adjustable impedance and is coupled to the control signal on line 30 for adjusting said impedance.

The averaged signal causes a second control signal or voltage $V_c$ to develop on line 182 across second variable impedance means 212. The control signal on line 30 adjusts the impedance of second variable impedance means 212 causing a corresponding adjustment of the control voltage $V_c$ developed on line 182. The control signal on line 30 remains substantially constant when the control voltage $V_c$ on line 182 is equal to the reference voltage at second input 204 of third amplifier 200 and the input signal is substantially constant.

Second adjustable impedance means 212 preferably comprises a second enhancement mode, metal-oxide-semiconductor field effect transistor 214 having a gate 216 coupled to line 30 and having an adjustable drain-to-source resistance controlled by the control signal on line 30 coupled between line 182 and circuit common 113. The drain-to-source resistance is controlled as a function of the control signal on line 30.

The first adjustable impedance 24, the second adjustable impedance 212 and a third adjustable impedance 24A in one preferred embodiment comprise a matched set of enhancement mode metal-oxide-semiconductor field effect transistors. Such transistors are preferably formed from a single substrate to improve their matched resistance characteristics and thermal proximity. In this manner, the control signal on line 30 assures that the adjustable impedances have substantially equal drain-to-source resistances over varying temperatures such that circuit 10 is inherently temperature stable.

Operation of the Circuit of FIGS. 2A AND 2B

The input signal on line 14 in one preferred embodiment is an AC signal representative of a parameter such as vortices of a vortex sensor. Such input signal comprises a fundamental signal which has a fundamental frequency representative of the parameter and associated noise at various frequencies caused by fluid turbulence and other factors not known to be repeatably representative of the parameter such as pipe vibrations and noise from acoustic sources. Pipe vibrations caused by pumps, motors and unsupported sections of pipe are usually in the 0–100 Hertz range. Acoustic noise is generally above 100 Hertz. Fluid turbulence results in noise on both sides of the fundamental frequency. Fluid turbulence noise generally increases in amplitude as the fundamental frequency increases, such that low frequency turbulence noise below the fundamental frequency should not be disproportionately amplified. The fundamental signal has a fundamental amplitude which varies proportional to the fundamental frequency of the fundamental signal. The fundamental frequency of the input signal is generally as low as 3 hertz for liquid and 30 hertz for gas such that significant noise is generally at higher frequency in low flow situations. The preferred embodiment of FIGS. 2A and 2B accommodates a fundamental amplitude which varies substantially proportional to the cube of the fundamental frequency. It is within the scope of the present invention to accommodate other input signal fundamental frequency to fundamental amplitude relationships by changing the number of amplifier stages or filters.

Filter 116 provides an AC impedance having a fixed rolloff frequency $f_{r1}$ of $$f_{r1} = \frac{1}{2\pi C_{114} R_{112}} \qquad \text{Equation 1}$$

Where
$C_{114}$ = capacitance of first capacitor 114
$R_{112}$ = resistance of first resistor 112
When switch 122 is in a closed position (shown open), Equation 1 becomes $$f_{r2} = \frac{1}{2\pi (C_{114} + C_{118}) R_{112}} \qquad \text{Equation 2}$$

Where
$C_{118}$ = capacitance of second capacitor 118
$f_{r2}$ = fixed rolloff frequency of filter 116 with switch 122 in a closed position.

In Equation 2, the fixed rolloff frequency $f_{r2}$ is reduced to accommodate a change in the input signal characteristics such as a change of fluid in a vortex sensor from gas to liquid.

The first adjustable filter 18 provides a further low pass filter characteristic and has a minimum rolloff frequency $f_{mr}$ of $$f_{mr} = \frac{1}{2\pi R_{144} C_{146}} \qquad \text{Equation 3}$$

where
$R_{144}$=resistance of third resistor 144
$C_{146}$=capacitance of fourth capacitor 146

The rolloff frequency of the first adjustable filter 18 is adjusted by changing the impedance of the first adjustable impedance 24, the rolloff frequency being adjusted in accord with $$f_{ar} = \frac{1}{2\pi \left(\frac{R_{144}R_T}{R_{144} + R_T}\right) C_{146}} \quad \text{Equation 4}$$

Where
$R_T$=resistance of fourth resistor 148 in series with the resistance of first impedance 24
$f_{ar}$=adjusted rolloff frequency of first adjustable filter 18.

When the resistance of first impedance 24 is large, corresponding to a minimal control signal, Equation 4 converges to Equation 3 and the rolloff frequency $f_{ar}$ of the first adjustable filter 18 approaches the minimum, $f_{mr}$.

The amplitude response of first amplifier 12 at the fundamental frequency of the input signal can be approximated as:

$$\frac{V_o}{V_{in}} = \frac{K(R_{144}R_T)/(R_{144} + R_T)}{\sqrt{\left(2\pi f_{in} C_{146}\left(\frac{R_{144}R_T}{R_{144} + R_T}\right)\right)^2 + 1}} \quad \text{Equation 5}$$

where
$V_o$=output signal on line 16
$V_{in}$=input signal to gate 134 of transistor 128
$K$=a constant such as the transconductance of transistor 128
$R_{144}$=resistance of third resistor 144
$R_T$=resistance of fourth resistor 148 plus resistance of first impedance means 24
$f_{in}$=input signal frequency
$C_{146}$=capacitance of fourth capacitor 146

Combining Equation 5 with Equation 4 yields the following relationship:

$$\frac{V_o}{V_{in}} = \frac{K\left(\frac{R_{144}R_T}{R_{144} + R_T}\right)}{\sqrt{\left(\frac{f_{in}}{f_{ar}}\right)^2 + 1}} \quad \text{Equation 6}$$

Where
$f_{ar}$=adjusted rolloff frequency of first adjustable filter 18.

From Equation 6, it is observed that the amplitude response is substantially constant for input signals having frequencies $f_{in}$ less than the fundamental frequency of the input signal. For such frequencies, the quantity $(f_{in}/f_{ar})^2$ is less than 1 and Equation 6 can be approximated as:

$$\frac{V_o}{V_{in}} = K\left(\frac{R_{144}R_T}{R_{144} + R_T}\right) \quad \text{Equation 7}$$

where $f_{in}$ is less than the adjusted rolloff frequency $f_{ar}$ which is substantially constant. At input frequencies greater than the fundamental frequency, Equation 6 can be approximated as:

$$\frac{V_o}{V_{in}} = \frac{K\left(\frac{R_{144}R_T}{R_{144} + R_T}\right) f_{ar}}{f_{in}} \quad \text{Equation 8}$$

Where $f_{in}$ is greater than the rolloff frequency $f_{ar}$. Equation 8 is basically a constant divided by the input signal frequency $f_{in}$ for steady state fundamental frequencies. From Equation 8 it is observed that the amplitude response of the combination of amplifier 12 and first adjustable filter 18 comprising first stage amplifier 8 decreases approximately 20 decibels per decade in response to input signals having frequencies greater than the fundamental frequency. Equations 6, 7 and 8 are similarly derived for second stage amplifier 8A.

Figure 3:
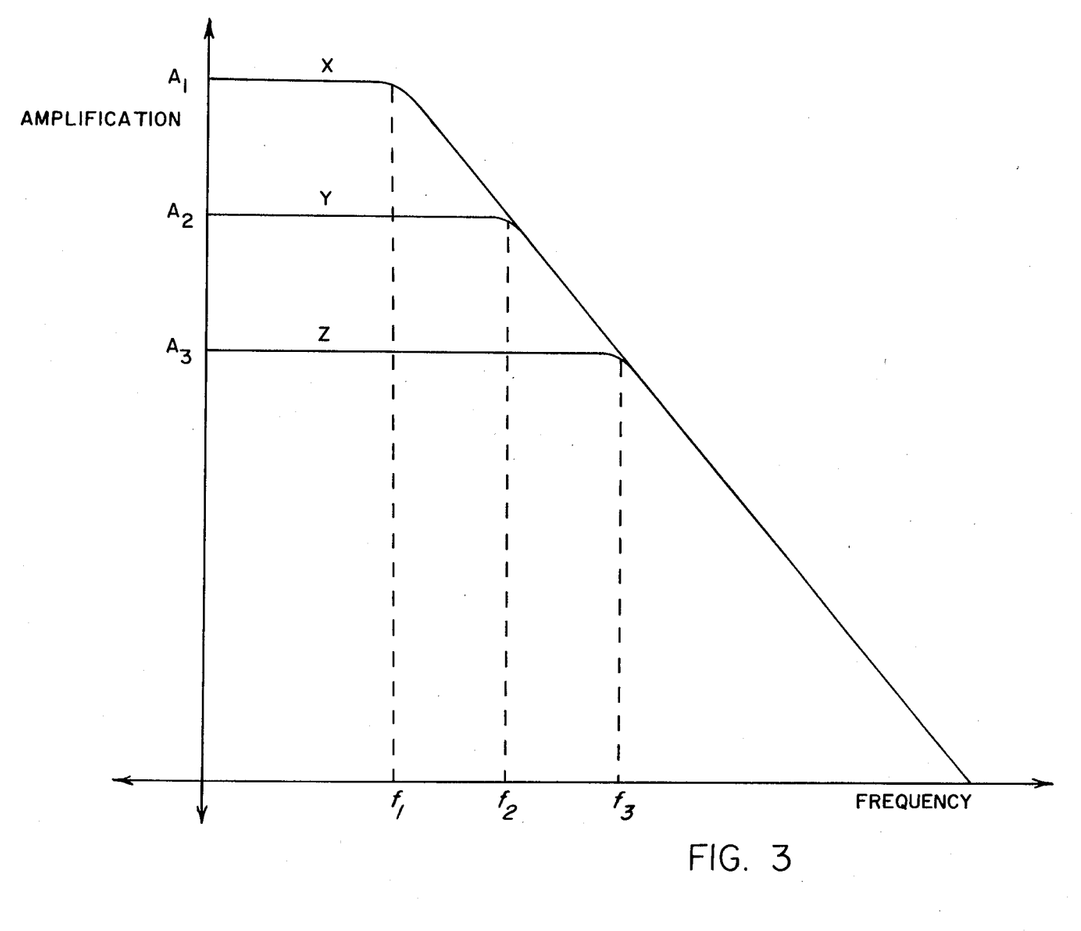
FIG. 3 is a Bode plot representation of a preferred transfer function of amplitude response versus frequency on a log-log scale of a first amplifier stage of the preferred circuit of FIGS. 2A and 2B.

The effects of Equation 6 are observed in a Bode plot of the transfer function of first stage amplifier 8 shown in FIG. 3. The transfer function has the form of an adjustable low pass filter rolling off at approximately 20 decibels per decade. The transfer function of the entire circuit 10 rolls off at approximately 60 decibels per decade in response to input signal frequencies greater than the fundamental frequency of the input signal and at an even greater rolloff when filter effects of capacitor 146B are manifested at frequencies higher than the maximum expected fundamental frequency. First adjustable filter 18 and second adjustable filter 18A preferably have the same minimum rolloff frequency $f_1$ which is equal to the minimum fundamental frequency desired to be measured. For the vortex type input signal, the minimum fundamental frequency is approximately 30 hertz for gas and approximately 3 hertz for liquid. Switch 122, when closed, adds second capacitor 118 to first filter 116 to decrease the rolloff frequency of filter 116, and adds fifth capacitor 154 and seventh capacitor 154A to first adjustable filter 18 and second adjustable filter 18A respectively to decrease their minimum rolloff frequencies to approximately 3 hertz. The rolloff frequency of first filter 116 is preferably less than the minimum rolloff frequencies of first adjustable filter 18 and second adjustable filter 18A. The AC impedance of first filter 116 is selected to match the input signal to the amplification and rolloff frequency characteristics of circuit 10 such that the rolloff frequency and fundamental frequency are preferably equal. With switch 122 open, the minimum rolloff frequencies of first adjustable filter 18 and second adjustable filter 18A are substantially equal to 30 hertz.

In FIG. 3, with the fundamental input frequency approximately equal to a minimum rolloff frequency $f_1$ of first stage amplifier 8, frequencies below the rolloff frequency $f_1$ are amplified at a substantially constant amplification $A_1$ as indicated by a transfer function X. Input frequencies greater than the minimum rolloff frequency $f_1$ are amplified at a level which decreases approximately 20 decibels per decade of frequency. If the fundamental frequency increases to rolloff frequency $f_2$, as indicated by a transfer function Y, input signals having frequencies less than rolloff frequency $f_2$ are amplified at about an amplification $A_2$ which is close or equal to the same amplification as input signals having frequencies equal to rolloff frequency $f_2$ are amplified along transfer function X. Input signals having frequencies greater than rolloff frequency $f_2$ are amplified at an amplification which is further decreased approximately 20 decibels per decade of frequency. Similarly, as indicated by a transfer function, as defined by Equation 6 a further increase in fundamental frequency of the input signal to rolloff frequency $f_3$ further decreases the level of amplification of signals less than the fundamental frequency at least 20 decibels per decade of fundamental frequency change ($f_3-f_2$) to an amplification $A_3$, while input signals having frequencies greater than rolloff frequency $f_3$ are amplified at a level which decreases about 20 decibels per decade of frequency. While such frequencies $f_1$, $f_2$ and $f_3$ are shown as discrete steps of frequency, circuit 10 is responsive to fundamental frequency changes in an analog manner; however, digital implementation of circuit 10 is within the scope of the present invention.

Describing FIG. 3 with reference to FIG. 2 in more detail, transfer function X corresponds to input signals having fundamental frequencies less than or approximately equal to the minimum rolloff frequency of first adjustable filter 18. The fundamental amplitude is small at such frequencies. The amplification of the first adjustable amplifier 12 is at its highest level $A_1$ because the resistance of first adjustable impedance 24 is large. The averaged signal on line 182 is small such that the second adjustable impedance means must be controlled to be large to develop a large enough control voltage $V_c$ on line 182 to match the reference voltage at second input 204 of amplifier 200. Since first adjustable impedance 24 and second adjustable impedance 212 preferably have matched drain-to-source resistance characteristics which are adjusted by the same control signal on line 30, both provide large, matched drain-to-source resistances at low fundamental frequencies. Low fundamental frequency input signals are amplified at the high amplification $A_1$ while noise components having higher frequencies than rolloff frequency $f_1$ are attenuated preferably about 20 decibels per decade of frequency.

As the fundamental frequency of the preferred input signal increases, so does its amplitude, initially causing an increase in the averaged signal on line 182 which causes an increase in the control signal on line 30. The increased control signal decreases the drain-to-source resistance of second adjustable impedance means 212 to match the voltages at the first and second inputs 202, 204 of amplifier 200. The drain-to-source resistance of first adjustable impedance 24 is also decreased, which increases the rolloff frequency in accord with Equation 4 and decreases the constant amplification portion of the transfer function in accord with Equation 7. Noise components of the input signal having frequencies lower than the increased rolloff frequency are amplified in accord with transfer function Y at a lower amplification $A_2$ than they would have been before the increase in rolloff frequency.

The 60 decibel per decade rolloff of circuit 10 is preferably selected to be inverse to the relationship of the fundamental amplitude of the fundamental signal to the fundamental frequency of the fundamental signal such that the rolloff frequency remains substantially equal to the fundamental frequency of the input signal. At high fundamental frequencies the fundamental amplitude of the fundamental signal has increased and noise components having frequencies higher than the fundamental frequency are attenuated at approximately 60 decibels per decade, while lower frequency noise is not disproportionately amplified such that the signal-to-noise ratio of the output signal is improved. At low fundamental frequencies, the circuit 10 enhances the input signal by providing its greatest amplification and by filtering noise having higher frequencies such that the output signal is an enhanced sinusoidal signal having a fairly constant amplitude and a frequency representative of the parameter.

One advantage of the present invention is that even though the preferred input signal comprises a large dynamic amplitude range, the effective range of circuit 10 is simultaneously adjusted to accommodate the input signal substantially without loss of accuracy. A substantially constant amplitude, sinusoidal output signal having a frequency responsive to the fundamental frequency of the input signal is provided between output terminals 300A and 300B.

A circuit in accordance with FIG. 2 was built and comprised the following list of components:

| | |
|---|---|
| Transistor 128 | SILICONIX 2N 4867A |
| Resistor 144 | $470 \times 10^3$ ohms |
| Resistor 140 | $220 \times 10^3$ ohms |
| Capacitor 142 | 10 uF |
| Resistor 112 | $10^9$ ohms |
| Capacitor 114 | 1500 pF |
| Capacitor 146 | .01 uF |
| Capacitor 154 | .1 uF |
| Capacitor 160 | .1 uF |
| Resistor 148 | $10^4$ ohms |

First adjustable impedance 24 comprised a model MC 14049 Hex inverting buffer having pin 6 coupled to resistor 148, pin 7 coupled to line 30 and pins 1 and 8 coupled to circuit common 113.

Second adjustable impedance means 212 comprised the same buffer further having pin 3 coupled to line 30 and pin 2 coupled to line 182.

First, second and third amplifiers 176, 186 and 200 comprised Intersil ICL 7613 DCTVs.

| | |
|---|---|
| Resistor 230 | $10^7$ ohms |
| Capacitor 232 | .047 uF |
| Capacitor 234 | 330 pF |

The circuit constructed operated essentially as described above in response to an input signal whose amplitude varied as the cube of its frequency. The components are selected for low power consumption for use in a two-wire system preferably having a 4–20 milliamp output signal from which all power for circuit is derived.

While the instant invention has been described by reference to several preferred embodiments, those skilled in the art recognize that various changes in form and detail may be made without departing from the spirit or scope of the invention.

What is claimed is:

1. An electrical circuit for providing an output signal having a frequency representative of an input signal which has a fundamental frequency which varies responsive to a parameter and noise components at frequencies other than the fundamental frequency, the circuit comprising:

amplifier means having an adjustable amplitude response for providing the output signal as a function of the input signal;

filter means coupled to the amplifier means for filtering the output signal and at least partially determining the amplitude response of the amplifier means, the filter means having an adjustable rolloff frequency characteristic with an adjustable rolloff;

first adjustable impedance means for adjusting the amplitude response of the amplifier means and the rolloff frequency characteristic of the filter means as a function of a control signal so that the rolloff frequency is substantially equal to the fundamental frequency; and control means for providing the control signal to the first adjustable impedance means to decrease the amplitude response and increase the rolloff frequency when the fundamental frequency increases and to increase the amplitude response and decrease the rolloff frequency when the fundamental frequency decreases.

2. An electrical circuit for providing an output signal having a frequency representative of an input signal which has a fundamental frequency which varies responsive to a parameter, the circuit comprising:

amplifier means having an adjustable amplitude response for providing the output signal as a function of the input signal;

filter means coupled to the amplifier means for filtering the output signal and at least partially determining the amplitude response of the amplifier means, the filter means having an adjustable rolloff frequency characteristic;

first adjustable impedance means for adjusting the amplitude response of the amplifier means and the rolloff frequency characteristic of the filter means as a function of a control signal so that the rolloff frequency is substantially equal to the fundamental frequency; and control means responsive to the output signal for providing the control signal to the first adjustable impedance means to adjust the first adjustable impedance means as a function of the output signal.

3. An electrical circuit for providing an output signal having a frequency representative of an input signal which has a fundamental frequency which varies responsive to a parameter, the circuit comprising:

amplifier means having an adjustable amplitude response for providing the output signal as a function of the input signal, having at least one input coupled to the input signal, and having an output;

filter means coupled to the amplifier means for filtering the output signal and at least partially determining the amplitude response of the amplifier means, the filter means having an adjustable rolloff frequency characteristic, the filter means comprising at least one capacitive element and at least one resistive element coupled in parallel and wherein the output of the amplifier means is coupled to an AC common through the capacitive element and the resistive element;

first adjustable impedance means for adjusting the amplitude response of the amplifier means and the rolloff frequency characteristic of the filter means as a function of a control signal; and control means responsive to the output signal for providing the control signal to the first adjustable impedance means to adjust the first adjustable impedance means as a function of the output signal.

4. The circuit of claim 3 wherein the amplitude response of the amplifier means is a function of at least one resistive element.

5. The circuit of claim 4 wherein the first adjustable impedance means further comprises a first enhancement mode, field effect transistor having a drain, a source and a gate and wherein the drain of the first enhancement mode transistor is connected to the filter means.

6. The circuit of claim 5 wherein the filter means attenuates frequencies greater than the rolloff frequency at least 20 decibels per decade.

7. The circuit of claim 5 wherein the first enhancement mode transistor has a gate and an adjustable drain-to-source resistance which is a function of the control signal at its gate.

8. An electrical circuit for providing an output signal having a frequency representative of an input signal which has a fundamental frequency which varies responsive to a parameter, the circuit comprising:

amplifier means having an adjustable amplitude response for providing the output signal as a function of the input signal;

filter means coupled to the amplifier means for filtering the output signal and at least partially determining the amplitude response of the amplifier means, the filter means having an adjustable rolloff frequency characteristic;

first adjustable impedance means for adjusting the amplitude response of the amplifier means and the rolloff frequency characteristic of the filter means as a function of a control signal; and control means comprising rectification means coupled to the output of the amplifier means for providing a rectified output signal; averaging means coupled to the rectification means for averaging the rectified output signal to provide an averaged signal; and converting means coupled to the averaging means for providing the control signal as a function of the averaged signal; the control means responding to the output signal for providing the control signal to the first adjustable impedance means to adjust the first adjustable impedance means as a function of the output signal.

9. The circuit according to claim 8 wherein the converting means comprises a converting amplifier having a first and second input, the first input coupled to a selected voltage and the second input coupled to the averaged signal.

10. The circuit of claim 9 wherein the converting means further comprises a second adjustable impedance means coupled to the second input of the converting amplifier, the averaged signal and the control signal, and having an impedance adjusted as a function of the control signal, for providing a second control signal to the second input of the converting amplifier as a function of the averaged signal and the impedance of the second adjustable impedance.

11. The circuit of claim 10 wherein the control signal adjusts the impedance of the second adjustable impedance means such that the second control signal is substantially equal to the selected voltage.

12. The circuit of claim 10 wherein the first and second adjustable impedance means comprise a matched set of enhancement mode, field effect transistors each transistor having a gate and a drain-to-source resistance, the gates being coupled to the control signal for controlling said transistors drain to source resistances.

13. An electrical circuit for providing a filtered output signal having a frequency representative of an input signal which has a fundamental component which varies responsive to a parameter, the fundamental component having a fundamental frequency, the circuit comprising:

an amplifier circuit having an input coupled to the input signal and an output for providing the filtered output signal as a function of the input signal, the amplifier circuit having an adjustable rolloff filter frequency and a constant amplitude response for input frequencies less than the adjustable rolloff filter frequency, the amplitude response of the amplifier circuit decreasing in response to frequencies greater than the adjustable rolloff filter frequency;

control means coupled to the output of the amplifier circuit for averaging the output signal to provide a control circuit signal which is a function of amplitude of the output signal; and first adjustable impedance means coupled to the amplifier circuit for adjusting the amplitude response and the rolloff frequency of the amplifier circuit as a function of the control signal to decrease the amplitude response and increase the rolloff frequency when the fundamental frequency increases and to increase the amplitude response and decrease the rolloff frequency when the fundamental frequency decreases.

14. An electrical circuit for providing an output signal having a frequency representative of an input signal with a fundamental frequency component which has an amplitude which varies proportional to the fundamental frequency, the circuit comprising:

an amplifier circuit having an input coupled to the input signal and an output for providing the output signal as a function of the input signal, the amplifier circuit having an adjustable rolloff frequency and a constant amplitude response for input frequencies less than the adjustable rolloff frequency, the amplitude response being controlled inversely proportional to the amplitude of the fundamental frequency component;

control means coupled to the output of the amplifier circuit for averaging the output signal to provide a control signal; and first adjustable impedance means coupled to the amplifier circuit for adjusting the amplitude response and the rolloff frequency of the amplifier circuit as a function of the control signal.

15. The circuit of claim 14 wherein the amplitude of the fundamental component varies substantially as the cube of the fundamental frequency and wherein the amplitude response of the amplifier circuit decreases at least 60 decibels per decade of increasing fundamental frequency such that the output signal has a substantially constant amplitude.

16. An electrical circuit for providing an output signal having a frequency representative of an input signal which has a fundamental frequency which varies responsive to a parameter, has an amplitude which varies substantially proportional to the cube of the fundamental frequency, and has noise components at frequencies other than the fundamental frequency, the circuit comprising:

an amplifier circuit for amplifying the input signal to provide the output signal, the amplifier circuit having an adjustable rolloff frequency and an adjustable amplification; and means connected to the amplifier circuit for decreasing the amplification and increasing the rolloff frequency when the fundamental frequency increases and for increasing the amplification and decreasing the rolloff frequency when the fundamental frequency decreases; the means comprising:

control means responsive to the output signal for providing a control signal as a function of amplitude of the output signal; and adjustable impedance means coupled to the amplifier circuit for adjusting the amplification and the rolloff frequency of the amplifier circuit as a function of the control signal.

17. The electrical circuit of claim 16 wherein the means connected to the amplifier circuit comprises:

control means responsive to the output signal for providing a control signal as a function of a characteristic of the output signal; and adjustable impedance means coupled to the amplifier circuit for adjusting the amplification and the rolloff frequency of the amplifier circuit as a function of the control signal.

18. An electrical circuit for providing an output signal having a frequency representative of an input signal which has a fundamental frequency which varies responsive to a parameter, has an amplitude which varies substantially proportional to the cube of the fundamental frequency, and has noise components at frequencies other than the fundamental frequency, the circuit comprising:

an amplifier circuit for amplifying the input signal to provide the output signal, the amplifier circuit having an adjustable rolloff frequency and an adjustable amplification;

control means responsive to the output signal for providing a control signal as a function of amplitude of the output signal; and adjustable impedance means coupled to the amplifier circuit for adjusting the amplification and the rolloff frequency of the amplifier circuit as a function of the control signal.

19. A system for providing an output signal having a frequency representative of fluid flow, the system comprising:

a vortex shedding flow sensor for providing a sensor signal which has a fundamental frequency and an amplitude which vary responsive to fluid flow and which includes noise components at frequencies other than the fundamental frequency;

an amplifier circuit having an input for receiving the sensor signal and an output for providing the output signal, the amplifier circuit having an adjustable rolloff frequency and an adjustable amplitude response;

adjustable impedance means for adjusting the amplitude response and the rolloff frequency as a function of a control signal; and control means for providing the control signal to the adjustable impedance means to decrease the amplitude response and increase the rolloff frequency when the fundamental frequency increases and to increase the amplitude response and decrease the rolloff frequency when the fundamental frequency decreases, so that the rolloff frequency is substantially equal to the fundamental frequency.

20. An electrical circuit for providing a filtered output signal having a frequency representative of an input signal which has a fundamental frequency which varies responsive to a parameter and noise components at frequencies other than the fundamental frequency, the circuit comprising:

amplifier means having an adjustable amplitude response for providing the filtered output signal as a function of the input signal;

filter means coupled to the amplifier means for filtering the output signal and at least partially determining the amplitude response of the amplifier means, the filter means having an adjustable rolloff frequency characteristic with an adjustable rolloff;

control means responsive to the filtered output signal for providing a control signal as a function of amplitude of the filtered output signal; and first adjustable impedance means responsive to the control signal for decreasing the amplitude response and increasing the rolloff frequency when the fundamental frequency increases and for increasing the amplitude response and decreasing the rolloff frequency when the fundamental frequency decreases.

* * * * *

UNITED STATES PATENT AND TRADEMARK OFFICE
CERTIFICATE OF CORRECTION

PATENT NO.   : 4,545,258

DATED        : October 8, 1985

INVENTOR(S)  : Thomas P. Coursolle

It is certified that error appears in the above-identified patent and that said Letters Patent is hereby corrected as shown below:

In column 4, line 8, the word "capacitor 11" should read --capacitor 118--.

In column 10, line 49, the numeral "10" should be inserted between the words "circuit" and "is", to read --circuit 10 is--.

Signed and Sealed this

Fourteenth Day of January 1986

[SEAL]

Attest:

Attesting Officer

DONALD J. QUIGG

Commissioner of Patents and Trademarks